United States Patent
Chung et al.

(10) Patent No.: US 7,810,698 B2
(45) Date of Patent: Oct. 12, 2010

(54) VISION SYSTEM FOR POSITIONING A BONDING TOOL

(75) Inventors: Kwok Kee Chung, Kwai Chung (HK); Wing Hong Leung, Kwai Chung (HK); Ka Fai Fung, Kwai Chung (HK); Chi Leung Vincent Mok, Kwai Chung (HK); Shun Ming Kenneth Fung, Kwai Chung (HK)

(73) Assignee: ASM Assembly Automation Ltd. (HK)

( * ) Notice: Subject to any disclaimer, the term of this patent is extended or adjusted under 35 U.S.C. 154(b) by 76 days.

(21) Appl. No.: 12/274,410

(22) Filed: Nov. 20, 2008

(65) Prior Publication Data

US 2010/0125348 A1  May 20, 2010

(51) Int. Cl.
  *B23K 20/00* (2006.01)
  *B23K 37/00* (2006.01)
(52) U.S. Cl. ............................ 228/102; 228/8; 228/105
(58) Field of Classification Search ................ None
  See application file for complete search history.

(56) References Cited

U.S. PATENT DOCUMENTS

| | | | |
|---|---|---|---|
| 5,909,837 A | 6/1999 | Safabakhsh et al. | |
| 5,934,543 A * | 8/1999 | Koduri | 228/102 |
| 6,006,977 A * | 12/1999 | Koduri | 228/4.5 |
| 6,206,266 B1 * | 3/2001 | Takahashi et al. | 228/102 |
| 6,337,489 B1 * | 1/2002 | Matsumoto et al. | 250/559.08 |
| 6,555,401 B2 | 4/2003 | Koduri | |
| 7,044,182 B2 * | 5/2006 | Haraguchi | 156/351 |
| 7,591,408 B2 * | 9/2009 | Walther | 228/103 |
| 7,644,852 B2 * | 1/2010 | Nishiura et al. | 228/9 |
| 2001/0016062 A1 * | 8/2001 | Enokido et al. | 382/152 |
| 2001/0016786 A1 * | 8/2001 | Takahashi et al. | 700/195 |
| 2001/0042770 A1 * | 11/2001 | Hayata et al. | 228/4.1 |
| 2002/0008131 A1 * | 1/2002 | Hess et al. | 228/105 |
| 2002/0039437 A1 * | 4/2002 | Sugawara | 382/151 |
| 2002/0104870 A1 * | 8/2002 | Nogawa | 228/4.5 |
| 2003/0012698 A1 * | 1/2003 | Hirota et al. | 422/100 |
| 2003/0030821 A1 * | 2/2003 | Hayata et al. | 356/622 |
| 2003/0098426 A1 * | 5/2003 | Hayata | 250/559.34 |
| 2003/0123866 A1 * | 7/2003 | Hayata | 396/80 |
| 2004/0060663 A1 * | 4/2004 | Haraguchi | 156/349 |
| 2004/0129364 A1 * | 7/2004 | Onitsuka | 156/64 |
| 2004/0188026 A1 * | 9/2004 | Kakutani | 156/391 |
| 2004/0188642 A1 * | 9/2004 | Kodama et al. | 250/559.29 |
| 2004/0261947 A1 * | 12/2004 | Haraguchi | 156/351 |
| 2005/0286060 A1 * | 12/2005 | Beatson et al. | 356/614 |
| 2006/0157537 A1 * | 7/2006 | Walther | 228/102 |
| 2006/0209910 A1 * | 9/2006 | Fukunaga | 372/9 |
| 2007/0181651 A1 * | 8/2007 | Takahashi et al. | 228/101 |
| 2008/0017293 A1 * | 1/2008 | Chung et al. | 156/64 |
| 2008/0145519 A1 * | 6/2008 | Kiguchi et al. | 427/64 |
| 2008/0151267 A1 * | 6/2008 | Yasuda et al. | 356/622 |
| 2008/0239327 A1 * | 10/2008 | Bryll | 356/623 |
| 2010/0059574 A1 * | 3/2010 | Arahata et al. | 228/180.5 |
| 2010/0072262 A1 * | 3/2010 | Sugawara et al. | 228/102 |
| 2010/0073653 A1 * | 3/2010 | Shibazaki | 355/53 |

FOREIGN PATENT DOCUMENTS

JP  05347326 A  * 12/1993

* cited by examiner

*Primary Examiner*—Kiley Stoner
(74) *Attorney, Agent, or Firm*—Ostrolenk Faber LLP

(57) ABSTRACT

An apparatus for correcting a positional offset of a bonding tool during bonding operations comprises a first fiducial mark and a second fiducial mark spaced from the first fiducial mark located on the bonding tool. A first imaging path emanates from the first fiducial mark and a second imaging path emanates from the second fiducial mark when the first and second fiducial marks are illuminated at a reference position. An optical system is positioned along the first and second imaging paths to view images of the first and second fiducial marks. A processor is operative to calculate a current position of the bonding tool and to compare it to a desired position so that the bonding tool's positional offset may be corrected by moving it to the desired position.

15 Claims, 2 Drawing Sheets

VISION SYSTEM FOR POSITIONING A BONDING TOOL

FIELD OF THE INVENTION

The invention relates to the assembly of semiconductor devices, and in particular, to determining a positional offset of a bonding tool used for semiconductor assembly and correcting the offset.

BACKGROUND OF PRIOR ART

The three-dimensional positioning of a bonding tool, such as a bond head of a die bonder, directly affects the bonding quality. For a die bond head, its position affects the placement accuracy of a die during die bonding operations, as well as bond line thickness of the adhesive underneath the bonded die. Therefore, accurate control of the bonding tool's horizontal and vertical positions is vital. Unfortunately, due to external factors such as thermal expansion during the bonding operations, the three-dimensional position of the bond head during bonding would vary under different working conditions.

A few methods have been implemented in the prior art to address this problem. One approach is to install a temperature sensor near the bonding tool, but the measured temperature generally does not correlate well to the bonding tool's position when the machine restarts bonding operation after a period of inactivity.

Another type of positioning control technique is described in U.S. Pat. No. 5,909,837 entitled "Contactless Bonding Tool Heater", which teaches the use of a radiant heating element opposite the bonding tool, the heating element being juxtaposed and separated from the tip of the bonding tool. The heating element serves to keep the bonding tool within a certain temperature range, and there is some attempt to calculate a compensation factor by estimating an amount of cooling of the bonding tool arising from the time and the length of the extension of the bonding tool away from its heating element. Nevertheless, this approach is not accurate because the temperature of the bonding tool itself is not monitored, and cannot be precisely controlled when the bonding tool is extended from the heating element.

Yet another approach is disclosed in U.S. Pat. No. 6,555,401 entitled "Method of Controlling Bond Process Quality by Measuring Wire Bond Features". In this approach, a first image of a bond pad is obtained before bond attachment to find a center of the bond pad, and a bonding tool is instructed to bond material to the center of the bond pad, before a second image of the bonded material is obtained. The coordinates of the bonded material and the center of the bond pad are compared to calculate any offset that is present, and the offset can then be corrected. A shortcoming of this method is that it cannot measure the vertical position of the bonding tool, since only the horizontal offset of the material can be observed from the second image that is obtained.

Due to the inadequacies of the said prior art positioning control methods, the problem of accurately detecting the positional offset of the bonding tool in real time and correcting it during bonding operations is still unresolved.

SUMMARY OF THE INVENTION

It is thus an object of the invention to seek to provide a vision system to measure and correct a three-dimensional position of a bonding tool during bonding operations which is accurate and avoids some of the aforesaid shortcomings of the prior art.

According to a first aspect of the invention, there is provided an apparatus for correcting a positional offset of a bonding tool during bonding operations, comprising: a first fiducial mark and a second fiducial mark spaced from the first fiducial mark located on the bonding tool, wherein a first imaging path emanates from the first fiducial mark and a second imaging path emanates from the second fiducial mark when the first and second fiducial marks are illuminated at a reference position; an optical system positioned along the first and second imaging paths which is operative to view images of the first and second fiducial marks; and a processor for calculating a current position of the bonding tool and for comparing it to a desired position so that the bonding tool's positional offset may be corrected by moving it to the desired position.

According to a second aspect of the invention, there is provided a method for correcting a positional offset of a bonding tool during bonding operations, comprising the steps of: positioning the bonding tool at a reference position, the bonding tool comprising a first fiducial mark and a second fiducial mark spaced from the first fidicual mark located on the bonding tool; illuminating the first and second fiducial marks such that a first imaging path emanates from the first fiducial mark and a second imaging path emanates from the second fiducial mark; positioning an optical system along the first and second imaging paths so as to view images of the first and second fiducial marks; calculating a current position of the bonding tool from the images with a processor and comparing the current position of the bonding tool to a desired position; and thereafter moving the bonding tool to the desired position to correct the positional offset.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of an apparatus and method for determining a positional offset of a bonding tool in order to correct the offset in accordance with the invention will now be described with reference to the accompanying drawings, in which.

DETAILED DESCRIPTION OF THE PREFERRED EMBODIMENT OF THE INVENTION

The bonding tool positioning control method according to the preferred embodiment of the invention works in two stages, namely calibration, followed by measurement during bonding operations. The result of the calibration is a set of parameters of an optical system that is required for measurement of the three-dimensional position of the bonding tool during bonding operations. Both calibration and measurement are conducted with the same apparatus.

Figure 1:
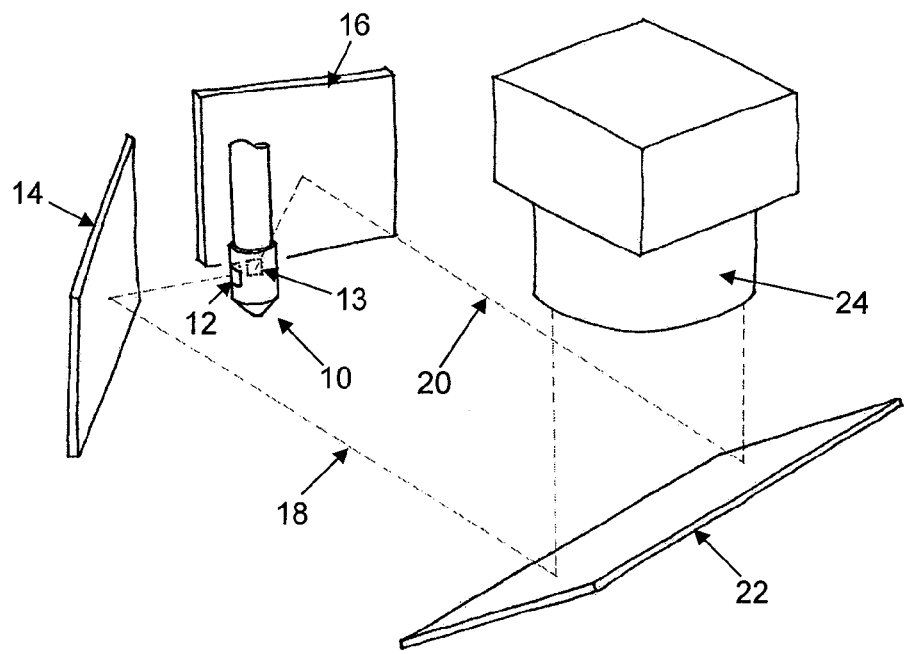
FIG. 1 is an isometric view of a schematic setup of an apparatus for determining and correcting a positional offset of a bonding tool.

FIG. 1 is an isometric view of a schematic setup of an apparatus for determining and correcting a positional offset of a bonding tool 10, such as a collet of a die bonder. The bonding tool 10 includes two landmarks or fiducial marks 12, 13 located on its surface (such as on the surface of the collet) which are spaced apart at a predetermined angle which is less than 180°. Coaxial light from an illumination system (not shown) is projected onto the fiducial marks 12, 13 to produce high contrast images for pattern registration. A slanted first reflective surface or mirror 14 is arranged to reflect an image of the first fiducial mark 12 and a slanted second reflective surface or mirror 16 is arranged to reflect an image of the second fiducial mark 13.

The illumination system illuminates the first and second fiducial marks 12, 13 when the bonding tool 10 is moved to a predetermined reference position as shown in FIG. 1. The high contrast images of the fiducial marks 12, 13 are transmitted along respective first and second imaging paths 18, 20 which emanate from the fiducial marks 12, 13. The first and second imaging paths 18, 20 may then be reflected by a third reflective surface or mirror 22 towards an optical system positioned along the first and second imaging paths 18, 20 for viewing the images. Although the optical system may comprise a single CCD camera 24 to view the images of the first and second fiducial marks 12, 13 simultaneously as in the illustrated embodiment, it is also conceivable that separate cameras may be used to view the two imaging paths 18, 20.

The imaging paths 18, 20 emanating from the fiducial marks 12, 13 preferably lie on a horizontal plane. The third mirror 22 is preferably arranged at an angle of 45° to the horizontal plane. The CCD camera 24 may thus be positioned vertically above the third mirror 22 to capture the images transmitted via the imaging paths 18, 20.

A pattern recognition system utilizing the CCD camera 24 recognizes the center positions of the fiducial marks 12, 13. A processor in communication with the pattern recognition system then applies a vision calibration algorithm (as described below) to register these two center positions to calculate the three-dimensional position of the bond head. The current position of the bonding tool 10 is compared to its desired position for conducting accurate bonding, and the bonding tool 10 may thereafter be moved to the desired position to correct its positional offset.

Figure 2:
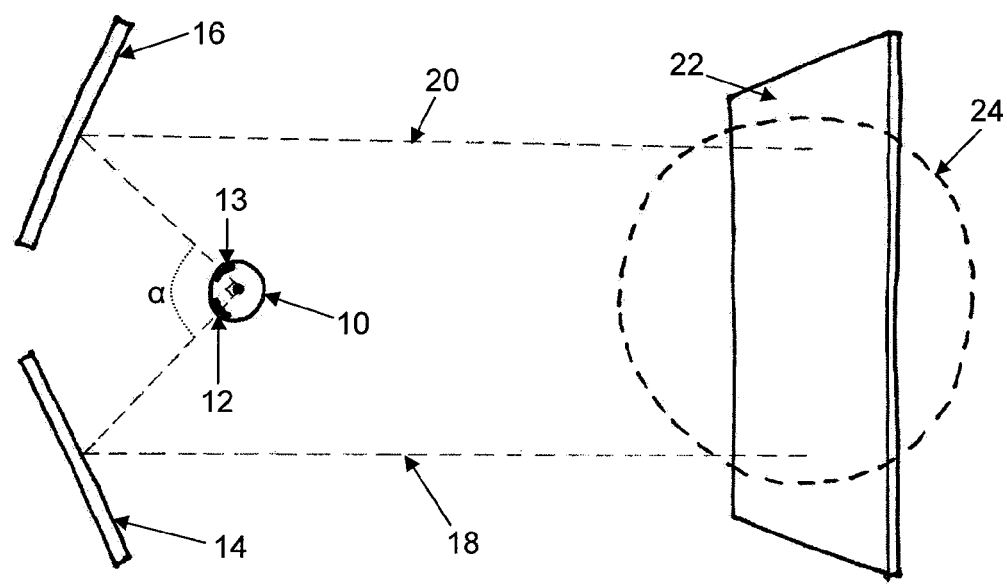
FIG. 2 is a top view of the schematic setup of the apparatus shown in FIG. 1.

FIG. 2 is a top view of the schematic setup of the apparatus shown in FIG. 1. The centers of the first and second fiducial marks 12, 13 are preferably spaced apart at an angle a of between 10° and 170° about a central longitudinal axis of the bonding tool 10, but more preferably at an angle a of between 70° and 110° about the central longitudinal axis of the bonding tool 10. The first and second mirrors 14, 16 are arranged such that the first and second imaging paths 18, 20 are reflected and project the images of the fiducial marks 12, 13 towards the third mirror 22, which in turn reflects the imaging paths 18, 20 and transmits the images to the CCD camera 24 positioned above it so that the images can be viewed simultaneously by the CCD camera 24. The first and second imaging paths 18, 20 are substantially parallel to each other at the position of the CCD camera 24.

Figure 3:
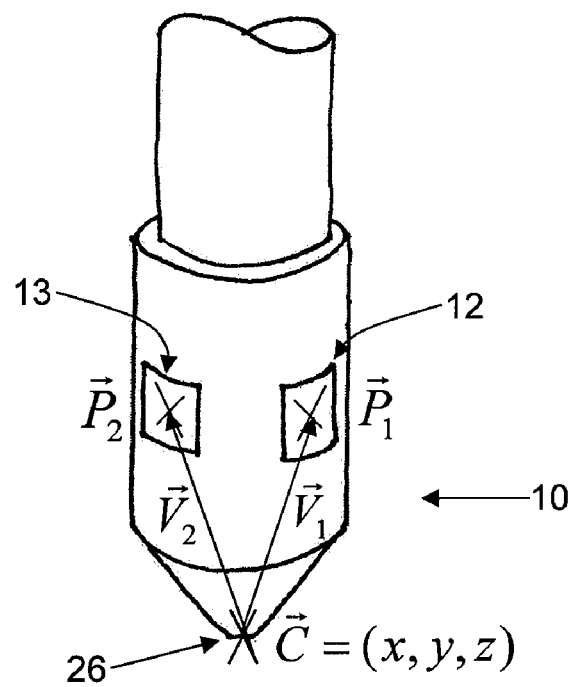
FIG. 3 is a side view of the bonding tool illustrating its fiducial marks.

FIG. 3 is a side view of the bonding tool illustrating its fiducial marks 12, 13. the center of the first fiducial mark 12 is represented as $\vec{P}_1$, and the center of the second fiducial mark 13 is represented as $\vec{P}_2$. The tip of the bonding tool 10 where bonding is carried out is represented as $\vec{C}$. The relationship between $\vec{C}$ and $\vec{P}_1$ and $\vec{P}_2$ respectively may be represented by the vectors $\vec{V}_1$ and $\vec{V}_2$. From the positions of $\vec{P}_1$ and $\vec{P}_2$, and their known vector relationships with $\vec{C}$, the position of $\vec{C}$ may be calculated.

Figure 4:
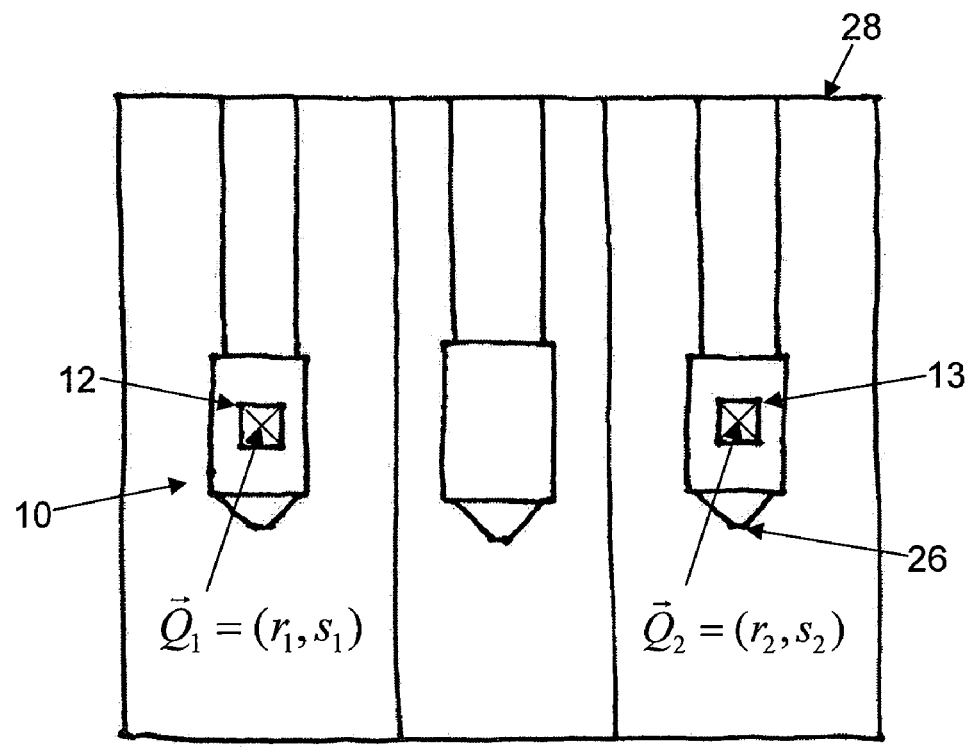
FIG. 4 is an example of an image captured by a CCD camera for determining the three-dimensional position of the bonding tool.

FIG. 4 is an example of an image 28 captured by the CCD camera 24 for determining the three-dimensional position of the bonding tool 10. A position of the center $\vec{Q}_1$ of the first fiducial mark 12 is represented by the relationship $\vec{Q}_1=(r_1,s_1)$. A position of the center $\vec{Q}_2$ of the second fiducial mark 13 is represented by the relationship $\vec{Q}_2=(r_2,s_2)$.

During calibration, the bonding tool 10 is first moved to the predetermined reference position as shown in FIGS. 1 and 2 where the fiducial marks 12, 13 can be viewed by the CCD camera 24. $\vec{C}=(x,y,z)$, $\vec{Q}_1=(r_1,s_1)$, $\vec{Q}_2=(r_2,s_2)$ may be used to define the positions of the three points which are calculated, where $\vec{C}$ is the three-dimensional position of the tip of the bonding tool 10, and $\vec{Q}_1$ and $\vec{Q}_2$ are the two-dimensional positions of the centers of the respective fiducial marks 12, 13 in the captured image 28.

With a pinhole camera model, $$A_1 \begin{pmatrix} \vec{P}_1 \\ 1 \end{pmatrix} = \vec{Q}_1,$$

where $A_1$ is the camera parameter matrix, the following formula may be applied to the left-hand image of the first fiducial mark 12:

$$L.H.S. = (A_{1a} \quad A_{1b}) \begin{pmatrix} \vec{C}+\vec{V}_1 \\ 1 \end{pmatrix}$$

$$= A_{1a}\vec{C} + A_{1a}\vec{V}_1 + A_{1b}$$

$$= (A_{1a} \quad A_{1a}\vec{V}_1 + A_{1b}) \begin{pmatrix} \vec{C} \\ 1 \end{pmatrix}$$

$$= A'_1 \begin{pmatrix} \vec{C} \\ 1 \end{pmatrix}$$

Therefore, $$A'_1 \begin{pmatrix} \vec{C} \\ 1 \end{pmatrix} = \vec{Q}_1.$$

Similarly, $$A'_2 \begin{pmatrix} \vec{C} \\ 1 \end{pmatrix} = \vec{Q}_2,$$

when applied to the right-hand image of the second fiducial mark 13.

Combining $\vec{Q}_1$ and $\vec{Q}_2$, $$\begin{pmatrix} A'_1 \\ A'_2 \end{pmatrix} \begin{pmatrix} \vec{C} \\ 1 \end{pmatrix} = \begin{pmatrix} \vec{Q}_1 \\ \vec{Q}_2 \end{pmatrix}$$

Simplifying the symbols, $$A \begin{pmatrix} \vec{C} \\ 1 \end{pmatrix} = \begin{pmatrix} \vec{Q}_1 \\ \vec{Q}_2 \end{pmatrix},$$

which may be expressed in matrix form as:

$$\begin{pmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{pmatrix} \begin{pmatrix} x \\ y \\ z \\ 1 \end{pmatrix} = \begin{pmatrix} r_1 \\ s_1 \\ r_2 \\ s_2 \end{pmatrix}$$

According to the above formulation, the aim during calibration is to obtain the values of the 16 elements of A from some of the measured bonding tool's physical positions (x,y,z) and the corresponding fiducial marks' image coordinates $(r_1, s_1)$ and $(r_2, s_2)$.

Calibration is done by first stopping the bonding tool 10 at the predetermined reference position. The first bonding tool position (x,y,z) is obtained from the bonding machine's motor counts. The image 28 is grabbed, from which the centers of the fiducial marks 12, 13 are grabbed and their coordinates $(r_1, s_1)$ and $(r_2, s_2)$ obtained.

Once a dataset $(x,y,z,r_1,s_1,r_2,s_2)$ is obtained, the bonding tool 10 may be shifted or offset slightly to a second bonding tool position at the vicinity of the predetermined reference position and then stopped to obtain a different positional value (x,y,z). The above step is repeated to obtain another dataset $(x,y,z,r_1,s_1,r_2,s_2)$ at the vicinity of the predetermined reference position. The bonding tool 10 is again shifted or offset slightly to obtain another different positional value (x,y,z) and the step is repeated again. One should obtain at least four datasets relating to the bonding tool 10 in the vicinity of the predetermined reference position as described above in order to complete the calibration.

After calibration, the 16 elements of A needed to complete the variables $a_{11}$-$a_{44}$ from the above matrix would be obtained. Thereafter, the bonding operation may commence.

During bonding, the bonding tool 10 will be periodically moved to the predetermined reference position where an image 28 of the fiducial marks 12, 13 will be captured by the CCD camera 24. After grabbing the image 28, a search is performed by the pattern recognition system to find the centers of the fiducial marks 12, 13, and their coordinates $(r_1, s_1)$ and $(r_2, s_2)$ are obtained. The measurement method may be as follows:

$$\begin{pmatrix} a_{11} & a_{12} & a_{13} & a_{14} \\ a_{21} & a_{22} & a_{23} & a_{24} \\ a_{31} & a_{32} & a_{33} & a_{34} \\ a_{41} & a_{42} & a_{43} & a_{44} \end{pmatrix} \begin{pmatrix} x \\ y \\ z \\ 1 \end{pmatrix} = \begin{pmatrix} r_1 \\ s_1 \\ r_2 \\ s_2 \end{pmatrix}$$

The above can be expressed as:

$$\begin{pmatrix} a_{11} & a_{12} & a_{13} \\ a_{21} & a_{22} & a_{23} \\ a_{31} & a_{32} & a_{33} \\ a_{41} & a_{42} & a_{43} \end{pmatrix} \begin{pmatrix} x \\ y \\ z \end{pmatrix} = \begin{pmatrix} r_1 - a_{14} \\ s_1 - a_{24} \\ r_2 - a_{34} \\ s_2 - a_{44} \end{pmatrix}$$

Thus, $$\begin{pmatrix} x \\ y \\ z \end{pmatrix} = \left[ \begin{pmatrix} a_{11} & a_{21} & a_{31} & a_{41} \\ a_{12} & a_{22} & a_{32} & a_{42} \\ a_{13} & a_{23} & a_{33} & a_{43} \end{pmatrix} \begin{pmatrix} a_{11} & a_{12} & a_{13} \\ a_{21} & a_{22} & a_{23} \\ a_{31} & a_{32} & a_{33} \\ a_{41} & a_{42} & a_{43} \end{pmatrix} \right]^{-1} \cdot \left[ \begin{pmatrix} a_{11} & a_{21} & a_{31} & a_{41} \\ a_{12} & a_{22} & a_{32} & a_{42} \\ a_{13} & a_{23} & a_{33} & a_{43} \end{pmatrix} \begin{pmatrix} r_1 - a_{14} \\ s_1 - a_{24} \\ r_2 - a_{34} \\ s_2 - a_{44} \end{pmatrix} \right]$$

Since the values of $a_{11}$-$a_{44}$ have been obtained through calibration and the coordinates $(r_1, s_1)$ and $(r_2, s_2)$ are calculated from the captured image 28, the position of the tip of the bonding tool (x,y,z) can be calculated immediately. The values of (x,y,z) may then be compared to the desired position of the tip of the bonding tool 10, so that the position of the tip may be corrected by the bonding machine to the desired position accordingly to compensate for any offset to the position of the bonding tool 10 due to thermal expansion or other factors.

It should be appreciated that the above method for determining the position of the bonding tool 10 according to the preferred embodiment of the invention is capable of measuring the three-dimensional position of the bond head in an efficient and cost-effective manner. The results that are obtained are also more effective and accurate than the conventional methods of controlling the position of the bonding tool 10 as described above.

The invention described herein is susceptible to variations, modifications and/or additions other than those specifically described and it is to be understood that the invention includes all such variations, modifications and/or additions which fall within the spirit and scope of the above description.

The invention claimed is:

1. An apparatus for correcting a positional offset of a bonding tool during bonding operations, comprising:
    a first fiducial mark and a second fiducial mark spaced from the first fiducial mark located on the bonding tool, wherein a first imaging path emanates from the first fiducial mark and a second imaging path emanates from the second fiducial mark when the first and second fiducial marks are illuminated at a reference position;
    an optical system positioned along the first and second imaging paths which is operative to view images of the first and second fiducial marks;
    a first reflective surface operative to reflect the first optical path from the first fiducial mark towards the optical system and a second reflective surface operative to reflect the second optical path from the second fiducial mark towards the optical system; and a processor for calculating a current position of the bonding tool and for comparing it to a desired position so that the bonding tool's positional offset may be corrected by moving it to the desired position.

2. The apparatus as claimed in claim 1, further comprising a third reflective surface operative to reflect the first and second optical paths from the first and second reflective surfaces respectively towards the optical system.

3. The apparatus as claimed in claim 1, wherein the optical system comprises a single CCD camera which is operative to view the images of the first and second fiducial marks simultaneously.

4. The apparatus as claimed in claim 1, wherein the centers of the first and second fiducial marks are spaced apart at an angle of between 10 and 170 about a central longitudinal axis of the bonding tool.

5. The apparatus as claimed in claim 4, wherein the centers of the first and second fiducial marks are spaced apart at an angle of between 70 and 110 about the central longitudinal axis of the bonding tool.

6. The apparatus as claimed in claim 1, wherein the first and second imaging paths are substantially parallel to each other at the position of the optical system.

7. The apparatus as claimed in claim 1, wherein the bonding tool is a die bonder and the first and second fiducial marks are located on a collet of the die bonder.

8. Method for correcting a positional offset of a bonding tool during bonding operations, comprising the steps of:

positioning the bonding tool at a reference position, the bonding tool comprising a first fiducial mark and a second fiducial mark spaced from the first fiducial mark located on the bonding tool;

illuminating the first and second fiducial marks such that a first imaging path emanates from the first fiducial mark and a second imaging path emanates from the second fiducial mark;

positioning an optical system along the first and second imaging paths so as to view images of the first and second fiducial marks;

reflecting the first optical path from the first fiducial mark towards the optical system with a first reflective surface, and reflecting the second optical path from the second fiducial mark towards the optical system with a second reflective surface; and calculating a current position of the bonding tool from the images with a processor and comparing the current position of the bonding tool to a desired position; and thereafter moving the bonding tool to the desired position to correct the positional offset.

9. The apparatus as claimed in claim 8, further comprising the step of reflecting the first and second optical paths from the first and second reflective surfaces respectively towards the optical system with a third reflective surface.

10. The method as claimed in claim 8, wherein the optical system comprises a single CCD camera which is operative to view the images of the first and second fiducial marks simultaneously.

11. The method as claimed in claim 8, wherein the centers of the first and second fiducial marks are spaced apart at an angle of between 10 and 170 about a central longitudinal axis of the bonding tool.

12. The method as claimed in claim 11, wherein the centers of the first and second fiducial marks are spaced apart at an angle of between 70 and 110 about the central longitudinal axis of the bonding tool.

13. The method as claimed in claim 8, wherein the first and second imaging paths are substantially parallel to each other at the position of the optical system.

14. The method as claimed in claim 8, wherein the bonding tool is a die bonder and the first and second fiducial marks are located on a collet of the die bonder.

15. The method as claimed in claim 8, further comprising the step of positioning the bonding tool at the reference position and calibrating parameters of the optical system by viewing images of the first and second fiducial marks at more than one offset position prior to performing bonding operations.

* * * * *